(12) United States Patent
Gunji et al.

(10) Patent No.: US 12,205,799 B2
(45) Date of Patent: Jan. 21, 2025

(54) PLASMA PROCESSING APPARATUS

(71) Applicant: Tokyo Electron Limited, Tokyo (JP)

(72) Inventors: Isao Gunji, Nirasaki (JP); Hiroyuki Miyashita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 117 days.

(21) Appl. No.: 18/058,989

(22) Filed: Nov. 28, 2022

(65) Prior Publication Data

US 2023/0178340 A1 Jun. 8, 2023

(30) Foreign Application Priority Data

Dec. 6, 2021 (JP) .................................. 2021-197596

(51) Int. Cl.
*H01J 37/32* (2006.01)

(52) U.S. Cl.
CPC .. *H01J 37/32238* (2013.01); *H01J 37/32449* (2013.01)

(58) Field of Classification Search
CPC ............. H01J 37/3244; H01J 37/32192; H01J 37/32201; H01J 37/32238; H01J 37/32449
See application file for complete search history.

(56) References Cited

U.S. PATENT DOCUMENTS

| 7,686,917 B2* | 3/2010 | Masuda | H01J 37/32972 118/712 |
| 2014/0179028 A1* | 6/2014 | Ueda | H01J 21/22 118/696 |
| 2015/0212127 A1* | 7/2015 | Ikeda | G01R 27/28 324/638 |
| 2015/0371828 A1* | 12/2015 | Stowell | C23C 16/4405 118/723 AN |
| 2017/0263417 A1* | 9/2017 | Ikeda | H01J 37/32266 |

FOREIGN PATENT DOCUMENTS

JP 2021-064508 A 4/2021

* cited by examiner

*Primary Examiner* — Tung X Le
(74) *Attorney, Agent, or Firm* — Armstrong Teasdale LLP

(57) ABSTRACT

A plasma processing apparatus includes: a processing container; a ceiling wall forming a part of the processing container and including an opening; and a transmission window configured to close the opening, wherein the opening under the transmission window is formed as a recess portion, wherein the recess portion is a supply port for supplying electromagnetic waves from the transmission window into the processing container, wherein first gas supply holes are formed on a lower surface of the ceiling wall, and wherein second gas supply holes are formed on an inner surface of the recess portion.

20 Claims, 7 Drawing Sheets

PLASMA PROCESSING APPARATUS

CROSS-REFERENCE TO RELATED APPLICATION

This application is based upon and claims the benefit of priority from Japanese Patent Application No. 2021-197596, filed on Dec. 6, 2021, the entire contents of which are incorporated herein by reference.

TECHNICAL FIELD

The present disclosure relates to a plasma processing apparatus.

BACKGROUND

In the related art, gas nozzles protruding from a ceiling wall of a processing container are known. The gas nozzles supply a relatively easily decomposable gas to a position below the lower surface of the ceiling wall and adjust the dissociation of the gas. It is difficult and costly to manufacture the gas nozzles protruding from the ceiling wall.

PRIOR ART DOCUMENTS

Patent Documents

Patent Document 1: Japanese Laid-Open Publication No. 2021-64508

SUMMARY

According to one embodiment of the present disclosure, there is provided a plasma processing apparatus including: a processing container; a ceiling wall forming a part of the processing container and including an opening; and a transmission window configured to close the opening, wherein the opening under the transmission window is formed as a recess portion, wherein the recess portion is a supply port for supplying electromagnetic waves from the transmission window into the processing container, wherein first gas supply holes are formed on a lower surface of the ceiling wall, and wherein second gas supply holes are formed on an inner surface of the recess portion.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
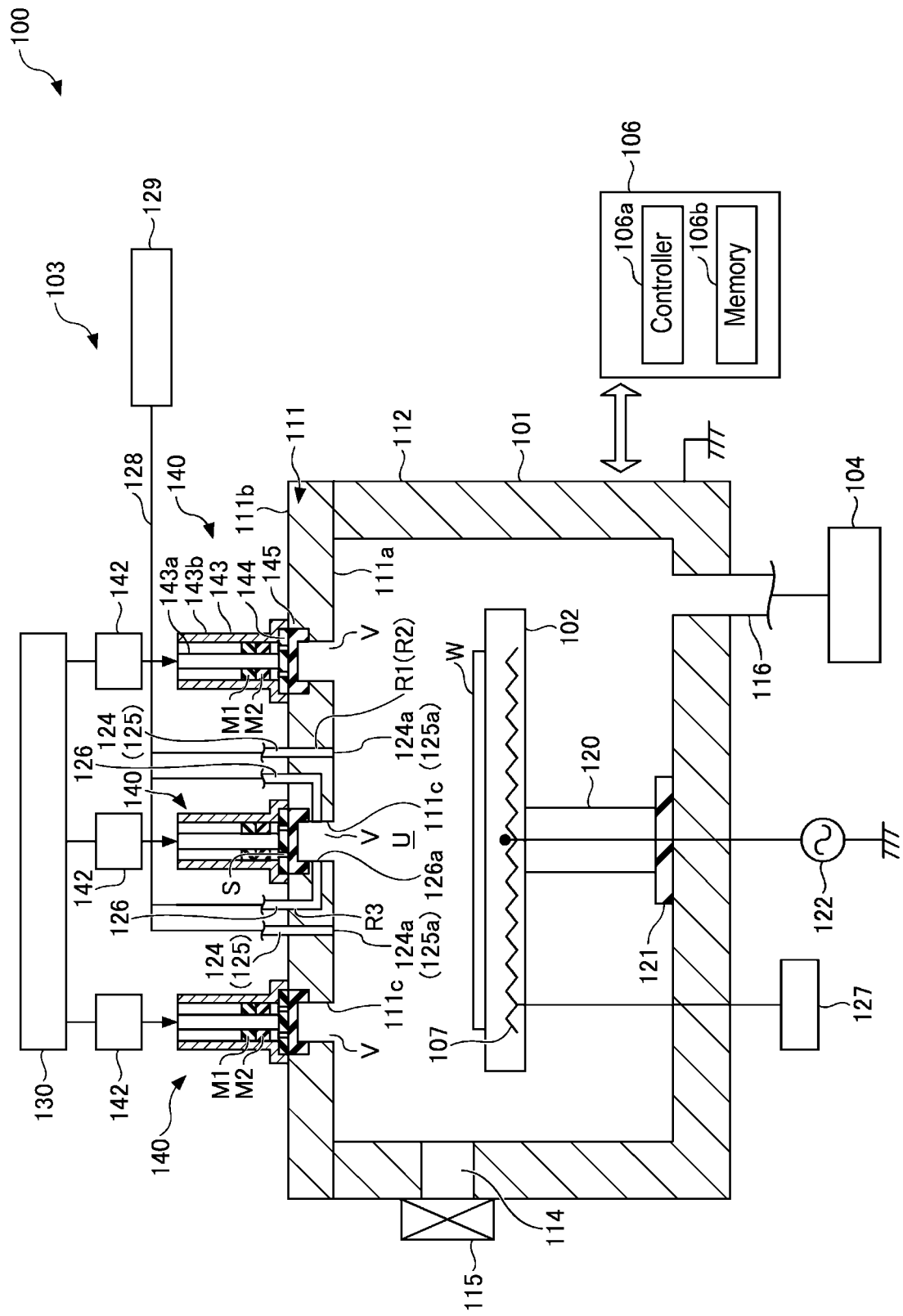
FIG. 1 is a schematic cross-sectional view showing an example of a plasma processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments for carrying out the present disclosure will be described with reference to the drawings. In each drawing, the same components are designated by the same reference numerals, and the redundant description thereof may be omitted.

In the present specification, directions such as parallel, perpendicular, orthogonal, horizontal, vertical, up/down, left/right, and the like are allowed to deviate to the extent that the effects of the embodiments are not impaired. The shape of corners is not limited to a right angle, and may be arcuately rounded. Parallel, perpendicular, orthogonal, horizontal, vertical, circular, and coincident may include substantially parallel, substantially perpendicular, substantially orthogonal, substantially horizontal, substantially vertical, substantially circular, and substantially coincident.

[Plasma Processing Apparatus]

An example of a plasma processing apparatus according to an embodiment will be described. FIG. 1 is a schematic cross-sectional view showing an example of a plasma processing apparatus 100 according to the embodiment. The plasma processing apparatus 100 includes a processing container 101, a mounting table 102, a gas supplier 103, an exhauster 104, a microwave radiation source 140, and a controller 106.

The processing container 101 is made of a metal material such as aluminum coated with yttria ($Y_2O_3$) or the like, and has a bottom-closed cylindrical container body 112 and a ceiling wall 111. The ceiling wall 111 is provided on the top of the container body 112. The ceiling wall 111 constitutes a part of the processing container 101. A plasma processing space U is formed by the container body 112 and the ceiling wall 111. The ceiling wall 111 has an upper surface 111$b$ and a lower surface 111$a$. The lower surface 111$a$ is exposed to the plasma processing space U. The ceiling wall 111 has openings. Microwave radiation sources 140 are arranged on the upper surface 111$b$ side so as to close the openings.

The mounting table 102 is arranged at the bottom of the processing container 101. The mounting table 102 has a disc shape and is made of a metal material such as aluminum whose surface is anodized, or a ceramic material such as aluminum nitride (AlN). The mounting table 102 mounts a substrate W such as a semiconductor wafer. The mounting table 102 is supported by a metal support member 120 extending upward from the bottom of the container body 112 via an insulating member 121.

Further, inside the mounting table 102, lift pins (not shown) for lifting the substrate W are provided so as to protrude and retract with respect to the upper surface of the mounting table 102. Moreover, a heater 107 as a heating means is provided inside the mounting table 102. The heater 107 is powered by a heater power source 127 to generate heat. By controlling the output of the heater 107 according to a temperature signal from a sensor (e.g., a thermocouple) provided near the upper surface of the mounting table 102, the substrate W is controlled to have a predetermined temperature.

A high-frequency power source 122 is electrically connected to the mounting table 102. In a case where the mounting table 102 is made of ceramics, an electrode is provided on the mounting table 102, and the high-frequency power source 122 is electrically connected to the electrode. The high-frequency power source 122 applies high-frequency power as bias power to the mounting table 102. The frequency of the high frequency power applied by the high-frequency power source 122 is preferably in the range of 0.4 to 27.12 MHz.

An exhaust pipe 116 is provided at the bottom of the container body 112, and the exhauster 104 is connected to the exhaust pipe 116. The exhauster 104 includes a vacuum pump, a pressure control valve, and the like. The inside of the processing container 101 is evacuated by the vacuum pump through the exhaust pipe 116 and is controlled to a desired vacuum state. The pressure inside the processing container 101 is controlled by a pressure control valve based on the value of a pressure gauge (not shown). The side wall of the container body 112 is provided with a loading/unloading port 114 for loading and unloading the substrate W into and from a transfer chamber (not shown) adjacent to the processing container 101. When the substrate W is loaded and unloaded, the loading/unloading port 114 is opened by a gate valve 115 provided along the side wall of the container body 112.

The microwave radiation sources 140 are arranged at six openings (only two of which are shown in FIG. 1) in the outer peripheral region of the ceiling wall 111 and one opening in the central region of the ceiling wall 111. In this embodiment, the transmission windows 145 at the lower ends of the seven microwave radiation sources 140 are configured to close the openings of the ceiling wall 111, so that all the microwave radiation sources 140 are installed on the upper surface 111b of the ceiling wall 111. However, the number and arrangement of the microwave radiation sources 140 are not limited thereto. For example, only one microwave radiation source 140 may be arranged in the central region of the ceiling wall 111, or multiple microwave radiation sources 140 may be arranged only in the outer peripheral region of the ceiling wall 111.

The microwave radiation sources 140 are connected to the microwave output part 130 via an amplifier 142. The microwave output part 130 generates microwaves, distributes the microwaves, and outputs the microwaves to the respective amplifier 142. Each amplifier 142 mainly amplifies the distributed microwaves and outputs the microwaves it to each microwave radiation source 140.

The microwave radiation source 140 includes an antenna module 143, a slot antenna 144, and a transmission window 145. The antenna module 143 is a coaxial waveguide having an inner conductor 143a and an outer conductor 143b arranged concentrically around the inner conductor 143a. Microwaves propagate in the space between the inner conductor 143a and the outer conductor 143b. Annular dielectric members M1 and M2 are provided in the space between the inner conductor 143a and the outer conductor 143b. The dielectric member M1 is disposed above the dielectric member M2. The dielectric members M1 and M2 are vertically movable to adjust the impedance.

A tip of the outer conductor 143b (a tip of the antenna module 143) is enlarged in diameter. A disk-shaped slot antenna 144 is fitted into the enlarged portion of the outer conductor 143b. The antenna module 143 and the slot antenna 144 are provided above (outside) the ceiling wall 111. The inner conductor 143a abuts on the center of the upper surface of the slot antenna 144. The slot antenna 144 has an arcuate or annular slot S around the center of the slot antenna 144. The slot antenna 144 has a function of an antenna that radiates microwaves from the slot S.

Below the slot antenna 144, there is provided the transmission window 145 through which the microwaves radiated from the slot S are radiated into the processing container 10. The transmission window 145 is made of a dielectric material such as alumina ($Al_2O_3$) and is configured to transmit microwaves. The transmission window 145 closes the opening provided in the ceiling wall 111 at a position above the opening. As a result, the opening below the transmission window 145 is formed as a recess portion V. The recess portion V functions as a supply port for supplying microwaves, which are an example of electromagnetic waves, to the plasma processing space U. The microwaves transmitted through the transmission window 145 are radiated from the supply port of the recess portion V to the plasma processing space U inside the processing container 101.

The gas supplier 103 includes gas introduction pipes 124 to 126, a gas supply pipe 128, and a gas supply source 129. The gas introduction pipes 124 to 126 are connected to the gas supply source 129 via the gas supply pipe 128. The gas introduction pipes 124 to 126 supply a gas from around the microwave radiation source 140 in the central region of the ceiling wall 111.

The gas introduction pipes 124 and 125 are connected respectively to first gas supply paths R1 and R2 configured to vertically penetrate the ceiling wall 111. The first gas supply path R1 has a first gas supply hole 124a opened on the lower surface 111a, and the first gas supply path R2 has a first gas supply hole 125a opened on the lower surface 111a (see FIG. 3A).

The gas introduction pipes 126 are connected to a second gas supply path R3 including a path 126b (see FIG. 3A) extending upward from the ceiling wall 111 and a path 126c bending laterally within the ceiling wall 111 and extending to the inner surface 111c of the recess portion V. The second gas supply path R3 has a second gas supply hole 126a opened on the inner surface 111c.

The gas supply source 129 supplies a processing gas. As an example, when forming a silicon nitride film (SiN) on the substrate W, an $N_2$ gas and/or $NH_3$ gas is supplied from the first gas supply holes 124a, and a $SiH_4$ (silane) gas is supplied from first gas supply holes 125a. In addition, an $N_2$ gas and/or $NH_3$ gas is supplied from the plurality of second gas supply holes 126a.

However, the supply of the processing gas is not limited thereto. The first gas supply hole 125a may supply a gas that is relatively easy to decompose, and the second gas supply hole 126a may supply a gas that is relatively difficult to decompose. The first gas supply hole 124a may supply the gas that is relatively easy to decompose or the gas that is relatively difficult to decompose.

The gas supply pipe 128 is provided with a valve for controlling the supply and stop of the processing gas and a flow rate controller for adjusting the flow rate of the processing gas.

The controller 106 is, for example, a computer including a controller 106a and a memory 106b. The controller 106 may include an input device, a display device, and the like. The controller 106a controls each part of the plasma processing apparatus 100. In the controller 106a, an operator can use an input device to input commands to manage the plasma processing apparatus 100. In addition, the controller 106a can visualize and display the operating status of the plasma processing apparatus 100 and the like using the display device. Further, the memory 106b stores control programs and recipe data for controlling various processes executed in the plasma processing apparatus 100 by the controller 106a. The controller 106a executes a control program to control each part of the plasma processing apparatus 100 according to recipe data, thereby executing substrate processing such as film formation or the like using the plasma processing apparatus 100.

[Gas Supply Mechanism]

Figure 2A:
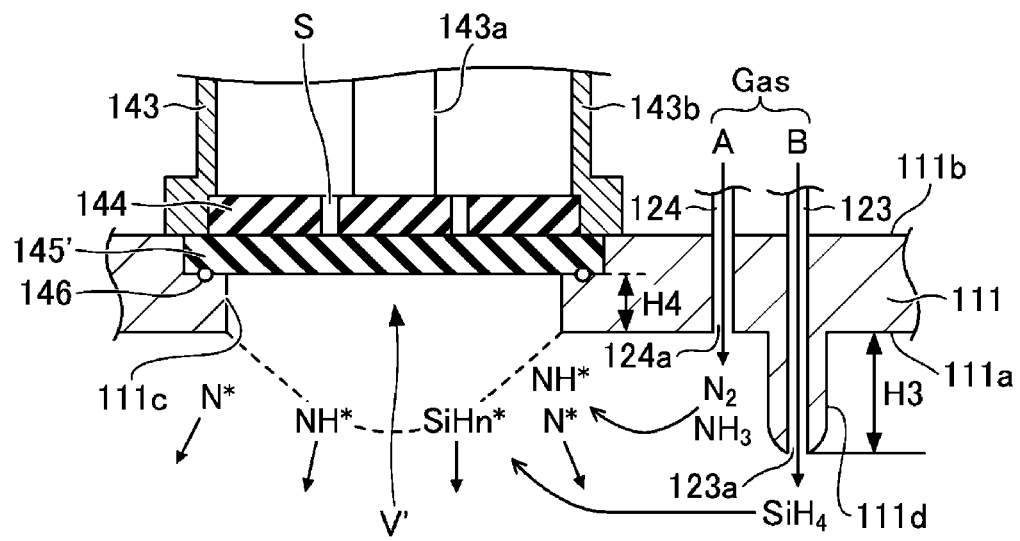
FIGS. 2A and 2B are diagrams showing an example of a gas supply structure according to a reference example.

Next, details of the gas supply structure near the supply port for supplying microwaves will be described with reference to FIGS. 2A, 2B, 3A, and 3B. FIG. 2A is a diagram showing an example of a gas supply structure according to a reference example. FIG. 3A is a diagram showing an example of a gas supply structure according to an embodiment.

In the reference example of FIG. 2A, a recess portion V' is formed under a transmission window 145'. The recess portion V' serves as a supply port for supplying microwaves radiated from a transmission window 145' into the processing container 101. The depth of the recess portion V is indicated by H4. In other words, the length of the inner side surface 111c of the recess portion V is H4. When gases A and B are supplied, the gas B, which is relatively easy to decompose, is supplied from the gas introduction pipes 123 to the gas supply holes 123a, and the gas A, which is relatively difficult to decompose, is supplied from the gas introduction pipes 124 to the first gas supply holes 124a. As an example, the processing gas B is a $SiH_4$ gas, and the processing gas A is an $N_2$ gas and/or $NH_3$ gas. In the reference example, the $SiH_4$ gas (gas B), which is relatively easy to decompose, is supplied into the processing container 101 from gas nozzles 111d projecting from the lower surface 111a of the ceiling wall 111. The length of the gas nozzles 111d from the lower surface 111a of the ceiling wall 111 is indicated by H3.

The transmission window 145' has a disk shape and closes the opening of the ceiling wall 111 from the upper surface 111b side of the opening. An O-ring 146 is provided at a boundary between the transmission window 145' and the ceiling wall 111. The O-ring 146 seals the inside of the processing container 101 from the atmosphere outside the processing container 101 and keeps the inside of the processing container 101 airtight.

The first gas supply holes 124a supply an $N_2$ gas and/or $NH_3$ gas into the processing container 101 from the lower surface 111a of the ceiling wall 111. The gas supply holes 123a supply the $SiH_4$ gas from a tip of the gas nozzle 111d.

Figure 2B:
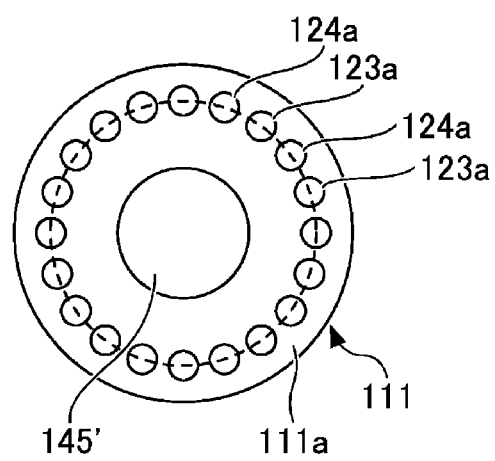
Figure 3A:
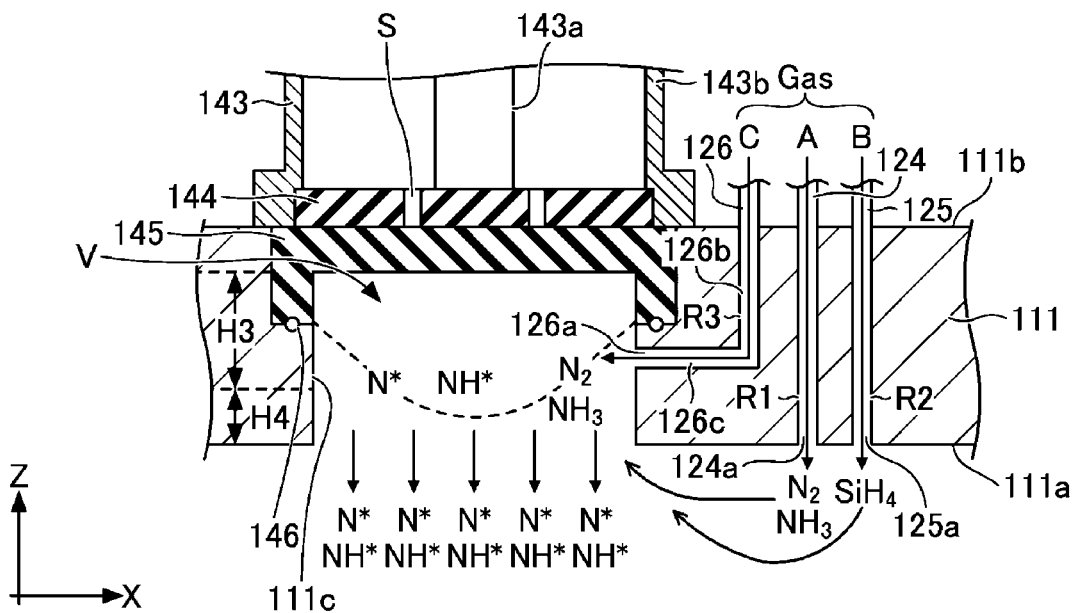
FIGS. 3A and 3B are diagrams showing an example of a gas supply structure according to the embodiment.

FIG. 2B is a diagram showing the vicinity of the recess portion V under the transmission window 145' as viewed from the lower surface 111a side of the ceiling wall 111. As shown in FIG. 2B, the first gas supply holes 124a and the gas supply holes 123a provided in the gas nozzle 111d are arranged on the same circumference. The gas supply holes 123a and the first gas supply holes 124a are provided alternately. In addition, in FIG. 2A, for the sake of convenience, the positions of the first gas supply holes 124a and the gas supply holes 123a are shown as if they are shifted in the radial direction.

The $N_2$ gas and/or $NH_3$ gas is activated by the plasma generated in the processing container 101 including the vicinity of the recess portion V', so that the gas can be easily reacted. A high-density plasma region is formed by the activated $N_2$ gas and/or $NH_3$ gas near the recess portion V. Therefore, if the $SiH_4$ gas supply position is close to the region of the recess portion V', the highly reactive $SiH_4$ gas may be polymerized in the gas phase and may fly onto the substrate W to become particles. In addition, abnormal discharge may occur in the gas supply holes 123a for supplying the $SiH_4$ gas.

Therefore, in the reference example, the $SiH_4$ gas is supplied from the supply holes 123a provided at the positions lower than the height of the first gas supply holes 124a for the $N_2$ gas and the $NH_3$ gas by the length H3 and located away from the high-density plasma region. Thus, a silicon nitride film is formed on the substrate W by causing the $SiH_4$ gas to react with the activated $N_2$ gas and/or $NH_3$ gas and nitriding Si derived from the $SiH_4$ gas. This suppresses generation of particles and suppresses abnormal discharge at the gas supply holes 123a for the $SiH_4$ gas.

However, in the reference example, by protruding the gas nozzles 111d downward from the lower surface 111a of the ceiling wall 111, the shape of the ceiling wall 111 becomes complicated, which leads to an increase in the difficulty of processing and thus the cost. In addition, since the ceiling wall 111 is made of aluminum, the ceiling wall 111 is thermally sprayed with a thermal spray film of yttria or the like in order to increase plasma resistance. However, during the spraying, the degree of difficulty of the thermal spraying process increases due to the protrusions of the gas nozzles 111d, which leads to an increase in the processing cost or the equipment cost.

Further, when the silicon nitride film adhering to the inner wall of the processing container 101 or the like is removed during cleaning, an $NF_3$ gas is supplied from the gas nozzle 111d. At that time, by-products such as aluminum fluoride (AlF) and yttrium fluoride (YF) adhere to the gas nozzles 111d and generate particles. In addition, due to the protrusions of the gas nozzles 111d, the arrangement of the gas supply holes may be limited, thereby hindering free design.

Therefore, in the gas supply structure according to the embodiment, as shown in FIG. 3A, the structure of the gas nozzles 111d is eliminated, and the lower surface 111a of the ceiling wall 111 is positioned downward by, for example, the length H3. That is, the ceiling wall 111 of the embodiment is formed thicker by H3 than the ceiling wall 111 of the reference example, and the high-density plasma region is shifted upward by H3. Thus, the first gas supply holes 124a for supplying the $N_2$ gas and/or $NH_3$ gas and the first gas supply holes 125a for supplying the $SiH_4$ gas are formed on the same surface (lower surface 111a) and on the same circumference. That is, the lower surface 111a of the ceiling wall 111 can be made flat, and the first gas supply holes 124a and 125a are provided at the same height. As a result, by simplifying the shape of the ceiling wall 111, it is possible to simplify the gas supply structure in the vicinity of the microwave supply port and reduce the degree of difficulty in processing.

In the embodiment of FIG. 3A, the recess portion V is formed below the transmission window 145. The recess portion V serves as a supply port for supplying microwaves radiated from the transmission window 145 into the processing container 101. The depth of the recess portion V is increased by the thickness of the ceiling wall 111 (i.e., H3), and the length of the inner side surface 111c of the recess portion V is H4+H3. The first gas supply holes 125a are configured to supply a SiH$_4$ gas (gas B) that is relatively easy to decompose, and the first gas supply holes 124a are configured to supply a N$_2$ gas and/or NH$_3$ gas (gas A) that is relatively difficult to decompose. However, the supply of the N$_2$ gas and/or NH$_3$ gas (gas A) that is relatively difficult to decompose from the first gas supply holes 124a is not essential due to the provided second gas supply holes 126a, which will be described later.

Figure 3B:
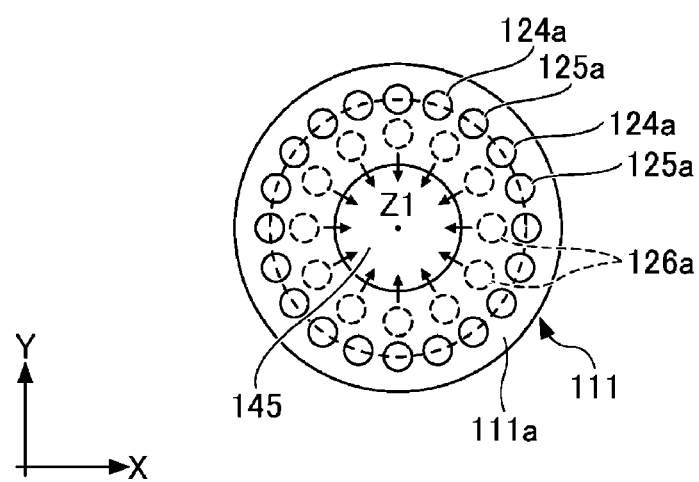

FIG. 3B is a diagram showing the vicinity of the recess portion V under the transmission window 145 as viewed from the lower surface 111a side of the ceiling wall 111. As shown in FIG. 3B, the first gas supply holes 125a for supplying the SiH$_4$ gas (gas B) and the first gas supply holes 124a for supplying the N$_2$ gas and/or NH$_3$ gas (gas A) are provided alternately on the same circumference. The first gas supply holes 125a and the first gas supply holes 124a are provided at regular intervals. In addition, in FIG. 3A, for the sake of convenience, the first gas supply holes 124a and the first gas supply holes 125a are shown as if they are shifted in the radial direction.

The depth of the recess portion V is larger than that of the reference example by the length of H3 at which the ceiling wall 111 is thickened. Therefore, the second gas supply holes 126a for supplying the N$_2$ gas and/or NH$_3$ gas are arranged on the inner side surface 111c of the recess portion V at regular intervals. Thus, the second gas supply holes 126a can be arranged apart from the first gas supply holes 124a and 125a. As a result, it is possible to prevent or suppress the occurrence of abnormal discharge in the first gas supply holes 125a and the occurrence of polymerization of the highly reactive SiH$_4$ gas in the gas phase, which may otherwise generate particles.

The N$_2$ gas and/or NH$_3$ gas is directly supplied to the high-density plasma region under the transmission window 145 from the second gas supply holes 126a. This can promote the activation of the N$_2$ gas and/or NH$_3$ gas.

The transmission window 145 has a downwardly recessed shape and has an annular thickness on the outer peripheral side. The O-ring 146 is provided at the boundary between the transmission window 145 and the ceiling wall 111. The O-ring 146 seals the inside of the processing container 101 from the atmosphere outside the processing container 101 and keeps the inside of the processing container 101 airtight.

Also in the embodiment, the ceiling wall 111 is coated with a thermally sprayed film of yttria or the like, and the inner wall of the recess portion V is also coated with a thermally sprayed film. On the other hand, the lower surface of the transmission window 145 is recessed, and the position of the O-ring 146 of the embodiment is lower than that of the reference example by the thickness of the outer periphery of the transmission window 145. As a result, the O-ring 146 can be arranged at a position where the plasma density and temperature are lower than those of the reference example, the consumption of the thermally sprayed film around the O-ring 146 can be reduced, and the time required until the maintenance and replacement of the ceiling wall 111 can be lengthened.

In view of the above, it is preferred that the second gas supply holes 126a are arranged at or below a position where the wear of the thermally sprayed film around the O-ring 146 can be reduced and at a position as close as possible to the high-density plasma region under the transmission window 145. As a result, the consumption of the thermally sprayed film in the recess portion V can be alleviated, and the activation of the N$_2$ gas and/or NH$_3$ gas can be promoted.

The N$_2$ gas and/or NH$_3$ gas supplied from the first gas supply holes 124a dilutes the SiH$_4$ gas supplied from the first gas supply holes 125a, and has the effect of suppressing the reactivity (decomposition) of the SiH$_4$ gas. Therefore, it is preferred that the first gas supply holes 124a and the first gas supply holes 125a are arranged alternately on the same circumference. However, the first gas supply holes 124a and the first gas supply holes 125a do not need to be arranged in pairs (e.g., alternately) as long as particles and abnormal discharge can be suppressed to the extent that they do not cause a problem. For example, the first gas supply holes 124a may be arranged on the inner peripheral side or the outer peripheral side of the first gas supply holes 125a. The first gas supply holes 124a may be omitted if the problem of particles and abnormal discharge can be resolved. According to the gas supply structure of the embodiment, by eliminating the protrusions from the lower surface 111a of the ceiling wall 111 and making the lower surface 111a flat, it is possible to increase a degree of freedom in designing the gas supply holes.

[Arrangement of Second Gas Supply Holes]

Figure 4A:
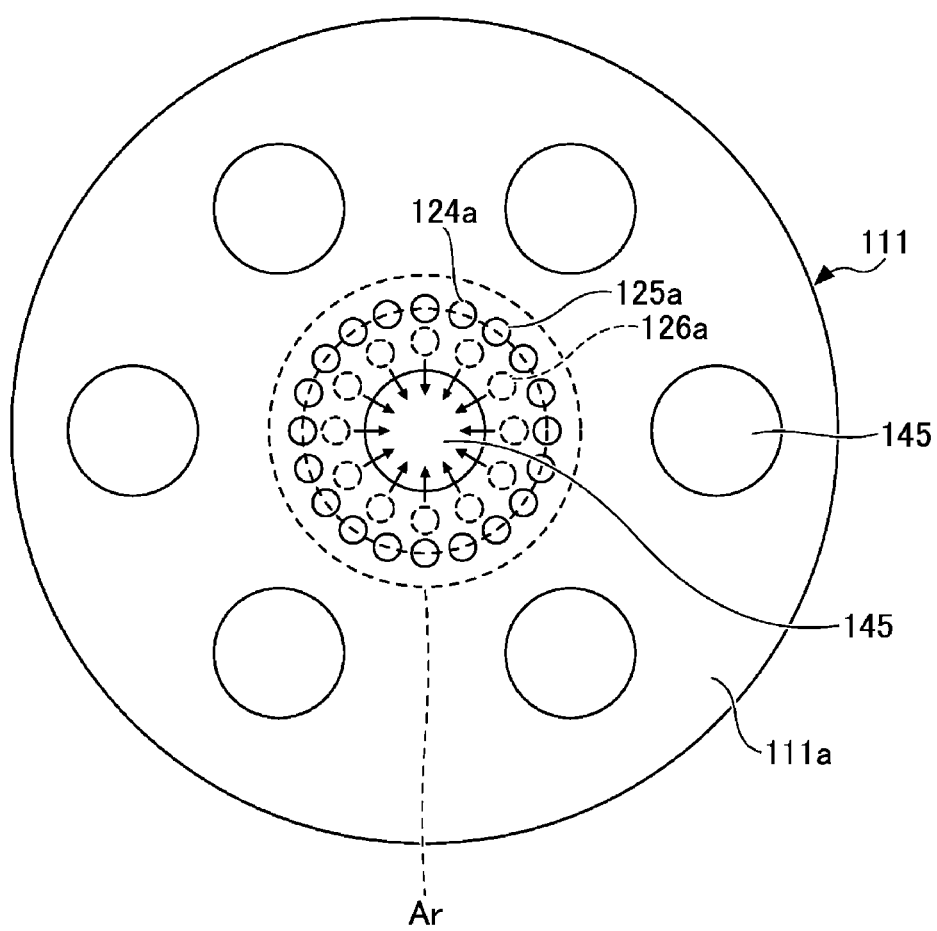
FIGS. 4A and 4B are diagrams showing an example of arrangement of gas supply holes according to the embodiment.
Figure 4B:
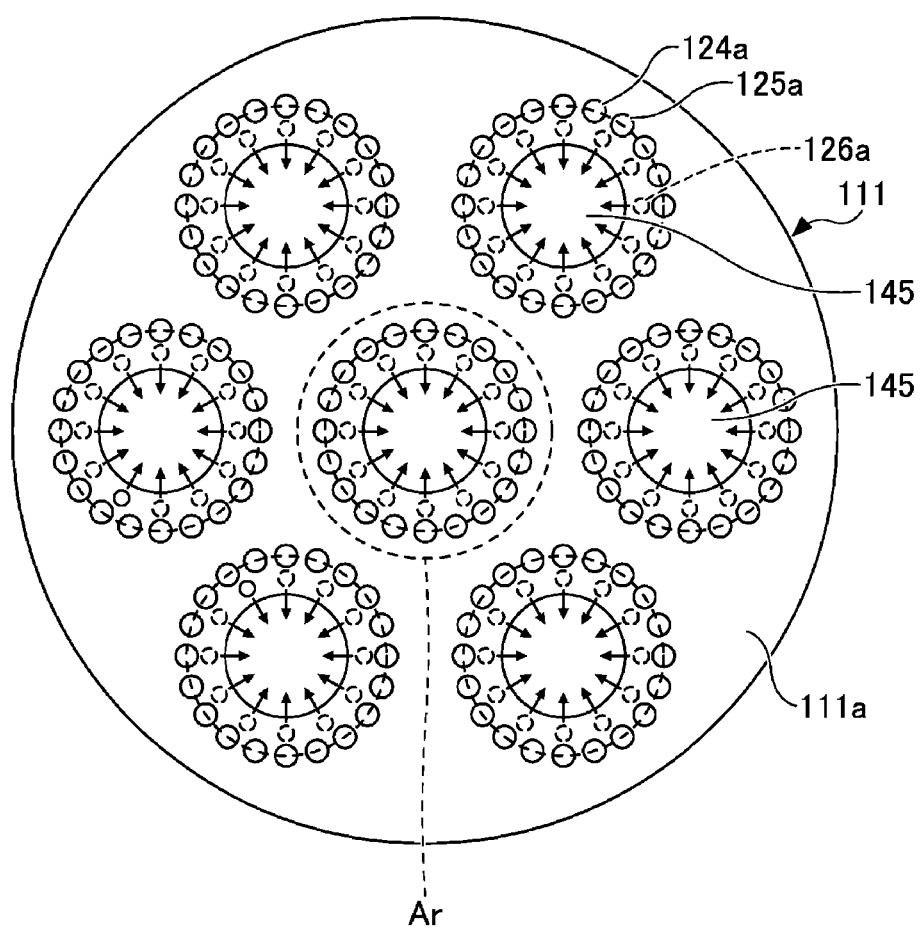

FIGS. 4A and 4B are diagrams showing an arrangement example of gas supply holes according to the embodiment. FIGS. 4A and 4B are diagrams showing the lower surface 111a of the ceiling wall 111. In FIGS. 4A and 4B, the inside and outside of the boundary line Ar indicated by a circle are divided into a central region and an outer peripheral region. In FIGS. 4A and 4B, the ceiling wall 111 has a total of seven openings, one in the central region and six in the outer peripheral region. The seven openings are closed by seven transmission windows 145. In FIG. 4A, the second gas supply holes 126a are provided on the inner side surface 111c of the recess portion V below the transmission window 145 that closes the opening in the central region among the seven openings. Around the second gas supply holes 126a, the first gas supply holes 124a and the first gas supply holes 125a are arranged alternately on the same circumference.

In FIG. 4B, the second gas supply holes 126a are provided for each of the inner side surfaces 111c of the seven recess portions V formed under the seven transmission windows 145 that close the seven openings. Around each of the second gas supply holes 126a, the first gas supply holes 124a and the first gas supply holes 125a are arranged alternately on the same circumference.

However, the arrangement of the gas supply holes in FIGS. 4A and 4B is merely an example, and the number and arrangement of the gas supply holes are not limited thereto. For example, the number of openings provided in the ceiling wall 111 may be zero or may be one or more in the central region. The number of openings provided in the ceiling wall 111 may be zero or may be a plurality other than six in the outer peripheral region.

[Orientation of Second Gas Supply Holes]

Figure 6A:
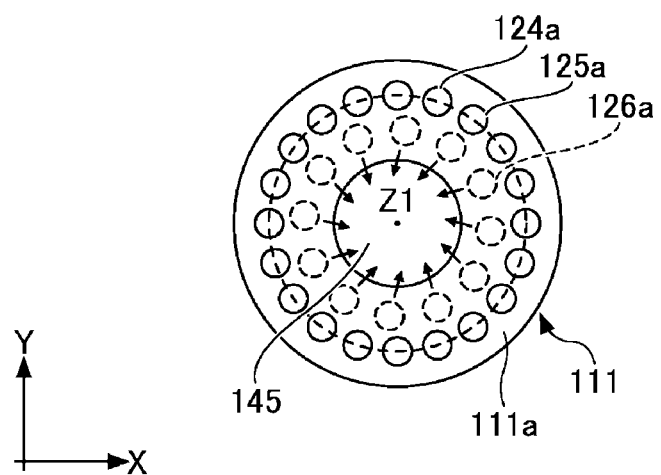
FIGS. 6A and 6B are diagrams showing an example of an angle (XY plane) of gas supply holes according to the embodiment.

The height direction of the recess portion V is defined as a Z direction, and the plane perpendicular to the Z direction is defined as an XY plane. The Z axis is an axis perpendicular to the lower surface 111a of the ceiling wall 111, and the XY plane is horizontal to the lower surface 111a. As shown in FIGS. 3B and 6A, the axis passing through the center of the transmission window 145 (the center of the recess portion V) is particularly defined as a Z1 axis.

Figure 5A:
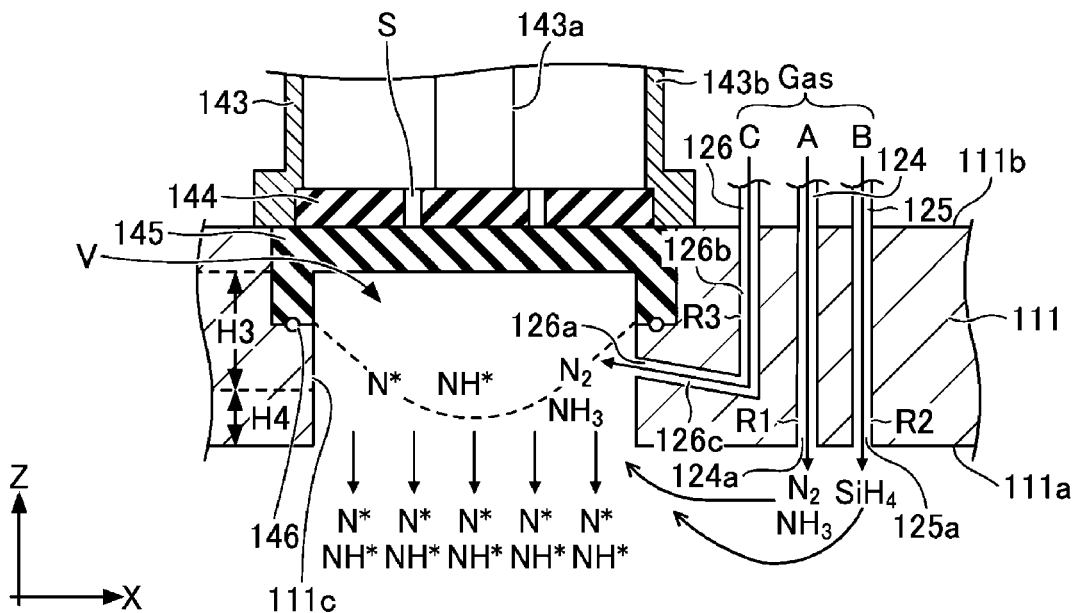
FIGS. 5A and 5B are diagrams showing an example of an angle (XZ plane) of gas supply holes according to the embodiment.
Figure 5B:
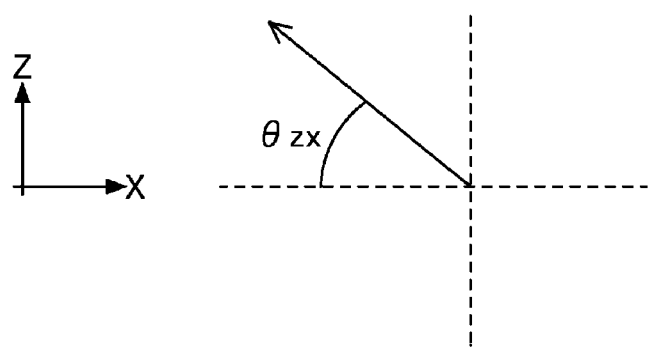
Figure 6B:
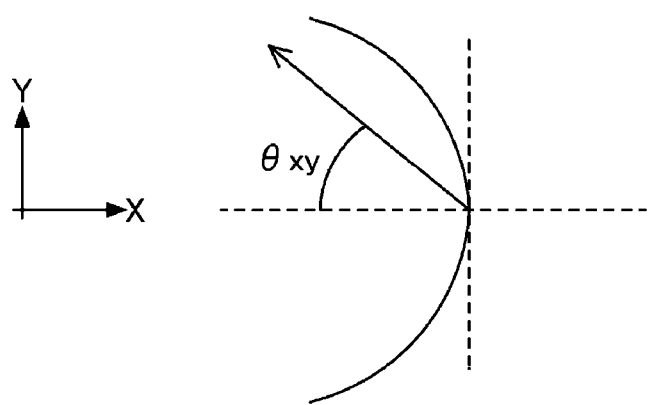

FIGS. 5A and 5B are diagrams showing an example of an angle of the second gas supply holes 126a in the XZ plane. FIGS. 6A and 6B are diagrams showing an example of an angle of the second gas supply holes 126a in the XY plane.

Comparing FIG. 5A with FIG. 3A, the second gas supply holes 126a shown in FIG. 3A are formed on the XY plane and are perpendicular to the Z direction. Further, as shown in FIG. 3B, all of the second gas supply holes 126a face the Z1 axis on the XY plane. That is, the second gas supply holes 126a shown in FIGS. 3A and 3B are opened perpendicularly to the inner surface of the recess portion V.

On the other hand, the second gas supply holes 126a shown in FIG. 5A are formed to be upturned from the XY plane and have an angle in the Z direction. As shown in FIG. 5B, an angle in the Z direction with respect to the X direction in the XZ plane is defined as θzx. In the second gas supply holes 126a shown in FIG. 5A, the angle θzx is greater than 0°, and may be, for example, 30° or more and 45° or less, or may be 45° or more. The angle θzx of the second gas supply holes 126a is not limited thereto. The second gas supply holes 126a may be formed to be upturned from the XY plane, and preferably upturned toward the transmission window 145.

Further, the second gas supply holes 126a shown in FIG. 5A face the Z1 axis in the XY plane just like the orientation indicated by an arrow in FIG. 3B. That is, the second gas supply holes 126a shown in FIG. 5A are opened straight without any inclination in the XY direction with respect to the inner surface of the recess portion V, and are opened to be upturned in the Z direction at an angle θzx larger than 0°. The angle θzx does not take a value smaller than 0°. That is, the second gas supply holes 126a are not opened at an angle downward with respect to the XY plane.

Plasma with a higher density is generated immediately below and in the vicinity of the transmission window 145 in the recess portion V. When the second gas supply holes 126a are opened so that the angle θzx in the Z direction becomes 0° as shown in FIG. 3A, the $N_2$ gases and/or $NH_3$ gases supplied in the horizontal direction from the second gas supply holes 126a arranged on the inner surface 111c tend to collide with each other in the recess portion V. On the other hand, if the second gas supply holes 126a are opened to be upturned so that the angle θzx becomes greater than 0° as shown in FIG. 5A, it is difficult for the $N_2$ gases and/or $NH_3$ gases to collide head-on with each other, and the gases flow smoothly to the vicinity directly below the transmission window 145. As a result, it is possible to promote activation of the $N_2$ gas and/or $NH_3$ gas in the high-density plasma region below the transmission window 145.

Further, assuming that an angle θxy in the X direction in which the second gas supply holes 126a face the Z1 axis in the XY plane is 0°, the second gas supply holes 126a shown in FIGS. 6A and 6B are opened laterally while having an inclination angle in the Y direction of θxy. The angle θxy may be positive or negative. When the angle θxy is positive as shown in FIG. 6B, all of the second gas supply holes 126a are opened at the same angle to the right with respect to the direction facing the Z1 axis. When the angle θxy is negative, all of the second gas supply holes 126a are opened at the same angle to the left with respect to the direction facing the Z1 axis.

Further, the angle θzx in the Z direction of the second gas supply holes 126a shown in FIGS. 6A and 6B may be 0° or may be greater than 0°. However, it is more preferable that the angle θzx in the Z direction of the second gas supply holes 126a shown in FIGS. 6A and 6B is greater than 0° and the second gas supply holes 126a are opened obliquely upward so as to generate a swirling flow.

Moreover, although it is preferable that all the angles θzx of the second gas supply holes 126a are set to the same angle, the second gas supply holes 126a may have slightly different orientations (angles). Similarly, although it is preferable that all the angles θxy of the second gas supply holes 126a are set to the same angle, the second gas supply holes 126a may have slightly different orientations (angles).

As described above, the second gas supply holes 126a are formed obliquely in the XY plane direction with respect to the direction facing the Z1 axis, which is the center axis of the recess portion V, and may be configured so that a swirling flow is generated in the recess portion V. As a result, the $N_2$ gas and/or $NH_3$ gas activated in the high-density plasma region forms a swirling flow and smoothly flows into the high-density plasma region, whereby a flow of active species can be formed so as to be pushed out from the recess portion V toward the first gas supply holes 124a and 125a.

By forming the swirling flow of the $N_2$ gas and/or $NH_3$ gas in the recess portion V in this way, the $N_2$ gas and/or $NH_3$ gas can be evenly supplied to the high-density plasma region, and the efficiency in activation of the $N_2$ gas and/or $NH_3$ gas can be increased. In addition, it is possible to avoid generation of a turbulent flow due to the collision of gases in the recess portion V, and it is possible to increase the efficiency in transporting the activated $N_2$ gas and/or $NH_3$ gas to the first gas supply holes 124a and 125a.

In order to improve the activation efficiency and transport efficiency of the $N_2$ gas and/or $NH_3$ gas, the angle θzx of the second gas supply holes 126a is preferably greater than 0 and the angle θxy preferably has a positive or negative value other than 0. In other words, the second gas supply holes 126a are preferably opened rightward, leftward, upward, obliquely upward and rightward, or obliquely upward and leftward when the horizontal direction facing the Z1 axis is defined as the X direction.

As described above, according to the plasma processing apparatus 100 of the present embodiment, the lower surface 111a is provided with the first gas supply holes 125a, and the inner surface 111c of the recess portion V is provided with the second gas supply holes 126a. As a result, the lower surface 111a has no protrusion, which makes it possible to simplify the gas supply structure in the vicinity of the electromagnetic wave supply port and to prevent or suppress the generation of particles and the occurrence of abnormal discharge.

[Others]

The number of first gas supply holes 124a and 125a and the number of second gas supply holes 126a may be the same or different.

It is preferable to independently control the $N_2$ gas and/or $NH_3$ gas supplied from the first gas supply holes 124a and the $N_2$ gas and/or $NH_3$ gas supplied from the second gas supply holes 126a. The $N_2$ gas and/or $NH_3$ gas supplied from the second gas supply holes 126a has a function of efficiently generating N radicals and/or NH radicals mainly by high-density plasma. On the other hand, the $N_2$ gas and $NH_3$ gas supplied from the first gas supply holes 124a has a function of diluting the $SiH_4$ gas supplied from the first gas supply holes 125a. It is preferred that the controller 106 separately performs the control operations necessary for causing the $N_2$ gas and/or $NH_3$ gas to exhibit different functions as described above, and optimizes the dissociation degrees and flow rates of the gas supplied from the first gas supply holes 124a and the gas supplied from the second gas supply holes 126a. This makes it possible to more effectively prevent or suppress the generation of particles and the occurrence of abnormal discharge. Further, it is possible to more accurately control the dissociation state of the $SiH_4$ gas and to form a SiN film having a good quality.

Therefore, the gas type and/or gas flow rate may be changed for the gas supplied from the first gas supply holes 124a and the gas supplied from the second gas supply holes 126a. For example, an $NH_3$ gas may be introduced from the second gas supply holes 126a and may be activated (dissociated). An $N_2$ gas may be introduced from the first gas supply holes 124*a*, and a silane gas may be diluted with the $N_2$ gas. Conversely, an $N_2$ gas may be introduced from the second gas supply holes 126*a*, and an $NH_3$ gas may be introduced from the first gas supply holes 124*a*. The gas supplied from the first gas supply holes 124*a* and/or the second gas supply holes 126*a* may be a gas other than the $N_2$ gas and the $NH_3$ gas and may be gases suitable for each process. For example, it may be conceivable to use an $H_2$ gas, an $N_2O$ gas, an NO gas, an $O_2$ gas, an $H_2O$ gas, and mixed gases thereof.

In order to individually control the flow rates of the gases supplied from three locations, i.e., the first gas supply holes 124*a* and 125*a* and the second gas supply holes 126*a*, it is preferable to provide flow rate controllers, one in the central region and one in the outer peripheral region for each of the three types of gas supply holes. In other words, it is preferable to arrange at least three flow rate controllers in the central region and at least three flow rate controllers in the outer peripheral region, six in total.

More preferably, three flow controllers are provided for each of the six gas supply structures for the six transmission windows 145 in the outer peripheral region, and one flow controller is provided for each gas supply structure for one transmission window 145 in the central region. In this case, a total of 21 flow rate controllers, 3 in the central region and 18 (=3×6) in the outer peripheral region, are arranged. Depending on the number and arrangement of the flow rate controllers, it is possible to more effectively control the flow rates of the various gases supplied from the three types of gas supply holes. Therefore, the generation of particles and the occurrence of abnormal discharge can be more effectively prevented or suppressed by controlling the degree of activation, transportation, and dilution of various gases with higher accuracy. Further, it is possible to control the dissociation state of the $SiH_4$ gas more accurately and to form a SiN film having a good quality.

The plasma processing apparatuses according to the embodiments disclosed this time should be considered to be exemplary and not limitative in all respects. The embodiments may be modified and improved in various ways without departing from the scope and spirit of the appended claims. The items described in the above-described embodiments may take other configurations within a consistent range and may be combined with each other within a consistent range.

According to the present disclosure in some embodiments, it is possible to efficiently activate a gas by plasma near a supply port of electromagnetic waves.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus, comprising:
   a processing container;
   a ceiling wall forming a part of the processing container and including an opening; and
   a transmission window configured to close the opening,
   wherein the opening under the transmission window is formed as a recess portion,
   wherein the recess portion is a supply port for supplying electromagnetic waves from the transmission window into the processing container,
   wherein first gas supply holes are formed on a lower surface of the ceiling wall,
   wherein second gas supply holes are formed on an inner surface of the recess portion,
   wherein the opening of the ceiling wall has a plurality of openings,
   wherein the transmission window includes a plurality of transmission windows configured to close the plurality of openings, and
   wherein the second gas supply holes are formed on the inner surface of the recess portion under each of the plurality of transmission windows.

2. The plasma processing apparatus of claim 1, wherein the first gas supply holes are configured to supply a gas that is relatively easy to decompose, and the second gas supply holes are configured to supply a gas that is relatively difficult to decompose.

3. The plasma processing apparatus of claim 1, wherein when a height direction of the recess portion is defined as a Z direction and a plane perpendicular to the Z direction is defined as an XY plane, the second gas supply holes are formed on the XY plane.

4. The plasma processing apparatus of claim 3, wherein the second gas supply holes are formed obliquely with respect to a direction facing a center axis of the recess portion.

5. The plasma processing apparatus of claim 4, wherein the second gas supply holes are configured to generate a swirling flow in the recess portion.

6. The plasma processing apparatus of claim 1, wherein the transmission window has a recessed lower surface.

7. The plasma processing apparatus of claim 1, wherein a first gas supply path having the first gas supply holes is configured to penetrate the ceiling wall in a vertical direction.

8. The plasma processing apparatus of claim 1, wherein a second gas supply path having the second gas supply holes is configured to bend laterally from above the ceiling wall and penetrate the inner surface of the recess portion.

9. The plasma processing apparatus of claim 1, wherein when a height direction of the recess portion is defined as a Z direction and a plane perpendicular to the Z direction is defined as an XY plane, the second gas supply holes are formed to be upturned from the XY plane.

10. The plasma processing apparatus of claim 9, wherein the second gas supply holes are formed to face the transmission window.

11. A plasma processing apparatus, comprising:
    a processing container;
    a ceiling wall forming a part of the processing container and including an opening; and
    a transmission window configured to close the opening,
    wherein the opening under the transmission window is formed as a recess portion,
    wherein the recess portion is a supply port for supplying electromagnetic waves from the transmission window into the processing container,
    wherein first gas supply holes are formed on a lower surface of the ceiling wall,
    wherein second gas supply holes are formed on an inner surface of the recess portion, wherein the opening of the ceiling wall has a plurality of openings,
wherein the transmission window includes a plurality of transmission windows configured to close the plurality of openings, and
wherein the second gas supply holes are formed on the inner surface of the recess portion under the transmission window in a central region among of the plurality of transmission windows.

12. The plasma processing apparatus of claim 11, wherein the first gas supply holes are configured to supply a gas that is relatively easy to decompose, and the second gas supply holes are configured to supply a gas that is relatively difficult to decompose.

13. The plasma processing apparatus of claim 11, wherein when a height direction of the recess portion is defined as a Z direction and a plane perpendicular to the Z direction is defined as an XY plane, the second gas supply holes are formed on the XY plane.

14. The plasma processing apparatus of claim 13, wherein the second gas supply holes are formed obliquely with respect to a direction facing a center axis of the recess portion.

15. The plasma processing apparatus of claim 14, wherein the second gas supply holes are configured to generate a swirling flow in the recess portion.

16. The plasma processing apparatus of claim 11, wherein the transmission window has a recessed lower surface.

17. The plasma processing apparatus of claim 11, wherein a first gas supply path having the first gas supply holes is configured to penetrate the ceiling wall in a vertical direction.

18. The plasma processing apparatus of claim 11, wherein a second gas supply path having the second gas supply holes is configured to bend laterally from above the ceiling wall and penetrate the inner surface of the recess portion.

19. The plasma processing apparatus of claim 11, wherein when a height direction of the recess portion is defined as a Z direction and a plane perpendicular to the Z direction is defined as an XY plane, the second gas supply holes are formed to be upturned from the XY plane.

20. The plasma processing apparatus of claim 19, wherein the second gas supply holes are formed to face the transmission window.

* * * * *